United States Patent [19]
Taguchi et al.

[11] Patent Number: 5,308,793
[45] Date of Patent: May 3, 1994

[54] METHOD FOR FORMING INTERCONNECTOR

[75] Inventors: Mitsuru Taguchi, Tokyo; Hirofumi Sumi, Kanagawa, both of Japan

[73] Assignee: Sony Corporation, Tokyo, Japan

[21] Appl. No.: 916,723

[22] Filed: Jul. 22, 1992

[30] Foreign Application Priority Data

Jul. 24, 1991 [JP] Japan .................. 3-206121

[51] Int. Cl.$^5$ .......................... H01L 21/44
[52] U.S. Cl. ................... 437/194; 437/203; 437/228; 437/189; 437/192
[58] Field of Search ............... 437/194, 203, 189, 192, 437/228

[56] References Cited

U.S. PATENT DOCUMENTS

| | | | |
|---|---|---|---|
| 4,641,420 | 2/1987 | Lee | 437/189 |
| 4,956,312 | 9/1990 | Van Laarhoven | 437/228 |
| 5,001,533 | 3/1991 | Yamaguchi. | |

FOREIGN PATENT DOCUMENTS

| | | | |
|---|---|---|---|
| 2-87622 | 3/1990 | Japan . | |
| 3-46329 | 2/1991 | Japan . | |
| 4-269831 | 9/1992 | Japan | 437/194 |

Primary Examiner—Olik Chaudhuri
Assistant Examiner—C. Everhart
Attorney, Agent, or Firm—Hill, Steadman & Simpson

[57] ABSTRACT

A method of forming an interconnector configuration includes an arrangement for preventing a Ti type barrier metal associated with an silicone oxide type interlayer insulation membrane, from becoming oxidized and therefore facilitating the burial of high aspect ratio connection holes in a Al layer.

The connection holes which are opened in the silicon oxide type interlayer insulation membrane are coated inside with a Ti type barrier metal are apt to be oxidized by oxygen which is released from the interlayer insulating membrane. This oxidation produces a reaction which deteriorates the reaction characteristics with a Al material layer during the burial of the connection holes and produces problems.

Accordingly, in order to prevent the oxidation of the barrier metal, a SiNx side wall layer is formed on the sides of the connection hole. The provision of this layer is not limited to the side walls of the connection holes and can be also provided on the upper surface of the interlayer insulation membrane with the same effect. Alternatively, the interlayer insulation membrane per se can be formed of SiNx. In either case, the reaction between the barrier metal and the Al material layer is desirably prevented and highly uniform filling of the through holes with Al can be achieved during the burial process.

22 Claims, 7 Drawing Sheets

METHOD FOR FORMING INTERCONNECTOR

BACKGROUND OF THE INVENTION

The present invention related generally to a method of forming interconnectors utilized in the construction of semiconductor device and the like, and more specifically to a method which prevents the oxidation of a substratum layer which provides a barrier metal type effect and enables the process by which an aluminium (Al) type material layer, which buries a connection hole, to be stabilized and to improve the characteristics thereof.

With the recent appearance of VLSI, ULSI etc., the design rules for semiconductor devices have become more stringent, and in order to arrange the interconnectors of substratum and upper layers, the diameters of the connection holes which are opened in the insulating membrane between the substratum and upper layers, have also become more minute, and the aspect ratio has exceeded 1.

The interconnectors of the upper layer is normally formed by sputtering aluminium type material, however with the above mentioned increase in aspect ratio, burying the connection holes so as to adequately achieve the required step coverage, has become more and more difficult event to the point of failing to provide the required connection.

In order to overcome this problem and achieving the desired step coverage, it has been recently proposed to use high temperature sputtering. With this technique, the wafer is heated to a temperature of several hundred degrees in a heating module or the like, while the sputtering process is carried out. This enables the reflow effect to induce the aluminium type material to achieve the required step coverage.

For example, 1989 IEEE/IRPS pages 210-214 discloses an example wherein bore holes having an opening diameter of 1.0 μm are uniformly buried in an Al-2% Cu alloy, and wherein a Ti substratum layer is interposed on a flat wafer surface.

Further, the 38th Applied Physics related League lecture meeting (1991 Annual Spring meeting) Volume 2 page 731 Subject No. 31p-W-7 discloses contact holes having a diameter of 0.25 μm, and an aspect ratio of 4, formed in an interposed 0.05 μm thick polycrystalline silicon layer and which are buried in Al-5% Ge alloy.

In the above, it is explained that a surface reaction occurs between the substratum and Al type layers and improves the burying process. More specifically, the Al type layer which is grown on the upper surface of the membrane which is firstly grown on the flat surface of the wafer, presses forward to the edge portion of the connection holes, and subsequently enters the same. At this time there is nothing in the connection holes, the Al type material layer coats the inner walls of the same. Upon reaching the flat surface of the substratum layer, while a chemical reaction occurs thereat, the Al type material continues to be pulled down into the connection hole until it is completely filled.

If the mechanism via which the burying processes occurs is considered, it is desirable to be able to apply the same to connection holes which have a high aspect ratio.

In connection with the above mechanism, it is an important point, especially with the side walls of the connection holes, whether the wetting characteristics between the substratum layer and the Al type material layer are good, in order that good burying characteristics are achieved.

However, high temperature Al sputtering causes heating of the wafer and has been observed to cause deterioration of the burying characteristics. This is mainly due to the Silicon Oxide ($SiO_2$) type interlayer insulation membrane becoming heated and releasing moisture and the like and giving off gas. This gas is deemed to contain oxygen in some instance.

This problem is illustrated in FIGS. 1a–1c in an example wherein the substratum layer is formed of Ti.

FIG. 1a shows a wafer which includes a substratum wiring layer 51 formed of a Al type material layer or a silicon base member in which suitable patterns are doped; a $SiO_2$ interlayer insulating membrane 52 formed using PSG (for example); and a connection hole 52a formed in the $SiO_2$ interlayer insulating membrane 52 and coated with a Ti barrier metal layer 53.

In order to conduct the high temperature sputtering via which the connection hole 52a can be buried, it is necessary to heat the wafer. This results in the release of moisture ($H_2O$) molecular and/or atomic (nascent) oxygen, which is absorbed into the Ti layer 53. As a result, as shown in FIG. 1b the Ti layer becomes partially oxidized and converted into TiOx such as indicated at 53a. The wetting characteristics of Al type layer at such sites is deteriorated.

Under these conditions, as the Al type material layer 54 is formed, a reaction between the Al layer and the TiOx layer 53a inhibits the smooth sliding of the Al layer thereover, and as shown in FIG. 1c, this tends to prevent the connection hole from becoming completely filled and results in the formation of a cavity 55.

OBJECT AND SUMMARY OF THE INVENTION

It is an object of the present invention to provide a wiring formation method via which the oxidation of substratum layers is prevented and complete burial of the connection holes with Al or aluminum alloy layers, is rendered possible.

In order to achieve the above object, it was firstly thought to prevent the moisture and oxygen from reaching the hole(s) formed in the $SiO_2$ interlayer insulation membrane using a layer of material which could trap the same and which was formed at least on the walls of the holes. A second line of thought which stemmed from this, was to make the interlayer insulation membrane of this particular material.

Accordingly, it was struck upon to use silicon nitride (SiNx) as the material via which the above could be achieved.

SiNx is a material that belongs to a class of material which does not contain the problematic water and oxygen and from which fine quality membranes can be formed. When a SiNx layer is provided at least on the walls of the connection holes and between the Ti layer, which becomes a substratum layer, and the insulation membrane, the SiNx layer prevents the oxidation of the substratum layer and thus enables the desired wetting characteristics to be established between the substratum layer and the Al type material layer to be achieved. This therefore, allows the Al type material layer to be formed in manner wherein the connection holes would be completely filled.

Therefore, in accordance with the first line of thought, an Al type material burial technique was proposed wherein connection holes were opened up in a SiO$_2$ interlayer insulation membrane and a layer of silicon nitride formed the walls of the holes. Following this, the connection hole(s) were coated with a substratum layer. In this instance, it was possible to cover the walls of the connection hole(s) with silicon nitride using a method which is referred to in the semiconductor field as side wall formation (full surface coverage + etching).

Further, if the upper surface of the insulation membrane is covered with SiNx in addition to the walls of the connection holes, it is possible to improve the degree to which the oxidation of the substratum layer is prevented. The invention therefore proposes not to limit to the walls of the through holes but to include coating the upper surface of the SiO$_2$ interlayer insulation membrane. That is to say, coating the upper surface of the SiO$_2$ interlayer insulation membrane with a first layer of SiNx or at least the connection hole walls with a second layer of SiNx. In accordance with this measure contact between the substratum layer and the SiO$_2$ interlayer insulation membrane is shutout across the whole face of the wafer, and the substratum layer oxidation inhibiting effect is uniformly improved. In fact, this second layer of SiNx can be formed via the application of the side wall formation technique.

On the other hand, in connection with the second line of thought, the technique was such that the connection holes are opened up in a SiNx interlayer insulation membrane and the holes buried in a Al type material layer after forming the barrier metal. In this case, if water and oxygen cannot be supplied from the walls of the connection holes, it is possible to directly coat the substratum layer thereon and thus eliminate a number of operations.

As indicated above, the present invention is such that the oxidation of a substratum layer can be prevented and the appropriate wetting characteristics with a Al type material layer can be achieved. As a result, it is possible to completely bury connections holes which have a high aspect ratio and to achieve the formation of interconnectors which exhibit desirably low resistance characteristics.

This therefore allows the production of semiconductor devices which have been designed in accordance with stringent design rules to exhibit a high integration degree, high performance and reliability.

BRIEF DESCRIPTION OF THE DRAWINGS

FIGS. 1a–1c are schematic cross-sectional views which show the problem which is encountered with the prior art interconnector formation method, and wherein: FIG. 1a shows a substratum layer which is covered with an interlayer insulating membrane of SiO$_2$ in which a connection hole is formed and coated, FIG. 1b shows the release of water and oxygen from the insulating membrane and the resulting oxidation which tends to occur, and FIG. 1c shows the cavity which tends to be formed due to the resulting deteriorated burying process;

FIGS. 2a–2d are schematic cross-sectional views which show the application of the present invention to the burial of a through hole, and wherein: FIG. 2a shows the state in which a through hole which is formed in a PSG interlayer insulating membrane, is coated with a SiNx layer, FIG. 2b shows SiNx layer etched so that only the side walls of the through hole are covered, FIG. 2c shows the interior of the through hole coated with a Ti layer, and FIG. 2d shows the through hole buried in a Al-1% si layer;

FIGS. 13a–13c are cross-sectional views which show another example of how a through hole can be buried in accordance with the present invention and wherein: FIG. 13a shows a SiNx interlayer insulation membrane formed over a substratum interconnector layer, FIG. 13b shows a through hole defined by patterning the SiNx layer; and FIG. 13c shows the through hole coated with a Ti layer and buried in a Al-1% Si layer;

FIGS. 14a–14c are cross-sectional views showing a further example of the application of the inventive technique and wherein: FIG. 14a shows a through hole formed in a SiNx interlayer insulation membrane coated with a SiNx layer, FIG. 14b shows the SiNx layer etched so that only the walls of the through hole remain covered, and FIG. 14c shows the through hole covered in a Ti layer and buried in a Al-1% Si layer.

DETAILED DESCRIPTION OF THE INVENTION

A detailed description of actual embodiments of the present invention will now be given with reference to the drawings.

EXAMPLE 1

This embodiment of the invention is such that a through hole is formed in PSG interlayer insulation membrane which overlays an interconnector layer, and is buried in a Al-1% Si layer. The process via which this is achieved is shown in FIGS. 2a–2d.

Figure 1A:
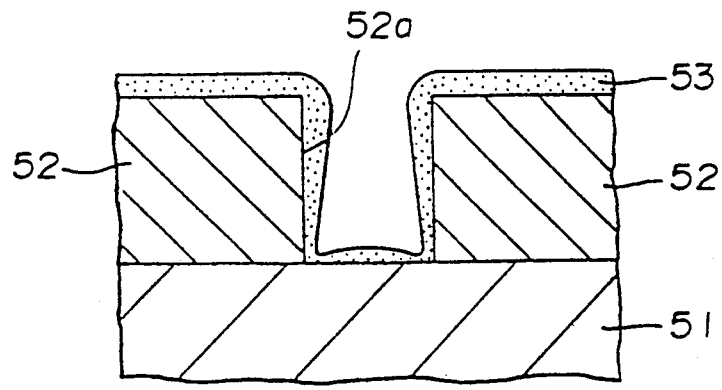
Figure 1B:
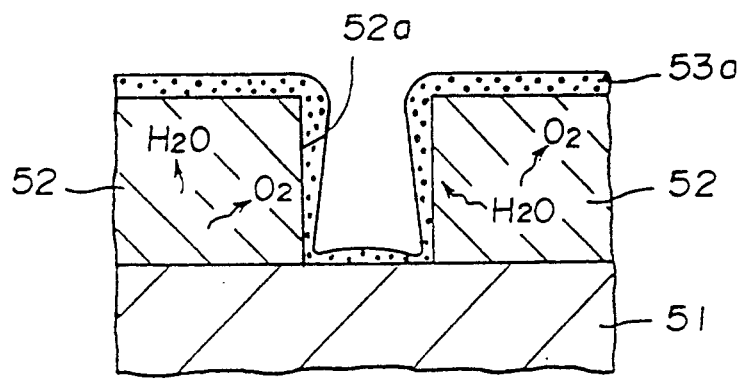
Figure 1C:
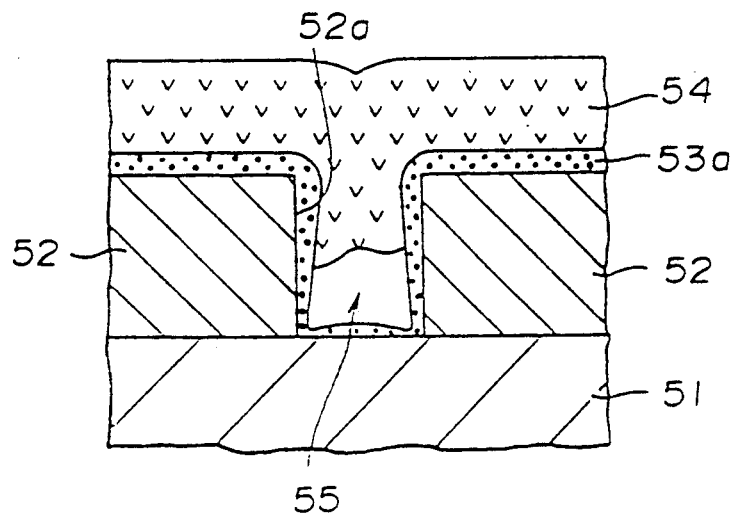
Figure 2A:
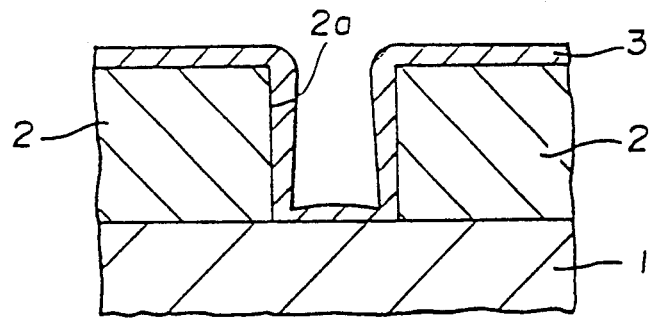
Figure 2B:
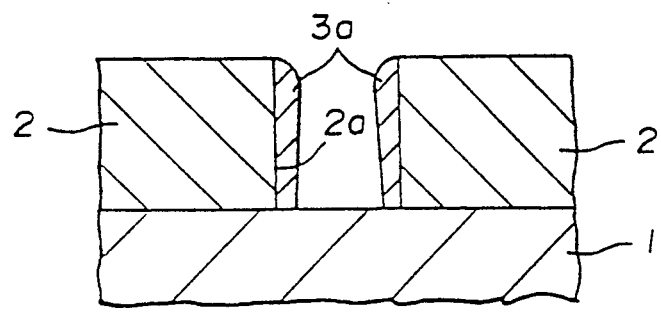

Firstly, as shown in FIG. 2a, a PSG interlayer insulating membrane having a thickness of approximately 0.8 μm was formed on top of a lower interconnector layer and then, using photolithographic and RIE (reaction type ion etching), a 0.4 μm through hole 2a was created. It should be noted that the substratum interconnector layer can be any one of an Al type material layer, a polycrystalline silicon layer, a high melting point metal silicide layer, a polycide membrane, or a semiconductor base plate in which doped regions are formed.

A 0.1 μm (approx) thick layer 3 of SiNx was formed so as to coat the whole upper surface of the wafer using plasma CVD method. In this instance, the layer formation conditions were SiH$_4$ flow amount 180 SCCM, NH$_3$ flow amount 500 SCCM, N$_2$ flow amount 720 SCCM, gas pressure 40 Pa (40 mTorr) and a wafer temperature of 250° C.

Following this, the above mentioned SiNx layer was etched. By way of example, this etching was carried out using a parallel line parallel plate type plasma etching device wherein the CHF$_3$ flow amount was 75 SCCM, O$_2$ flow amount 25 SCCM, gas pressure 5.3 Pa (40 mTorr), RF power 600 W (13.56 MHz). The effect of the above was such as to result in an arrangement shown in FIG. 2b, wherein only the side wall of the through hole 2a was left covered by the SiNx layer.

Following this, the Ti layer 4, which provides the barrier metal effect, and the Al-1% Si layer which defines the interconnector layer were formed in a multi-chamber type sputtering device. This type of device is such that the Ti sputtering chamber and the Al sputtering chamber are connected by way of a gate valve and possibly a wafer handling unit, connected under high positive pressure. With this device while the wafer is between chambers, the wafer is not exposed to atmospheric air and therefore the process can be continuously carried out.

Figure 2C:
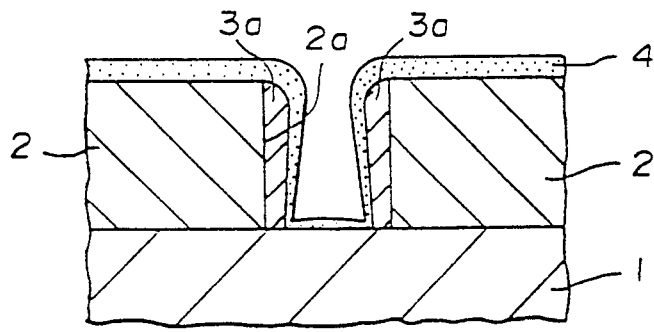

As shown in FIG. 2c, the upper surface of the wafer was then completely covered with a Ti layer 4 having a thickness of approximately 0.1 μm. This formation was achieved using a common sputtering method—for example using a sputtering atmosphere wherein the Ar flow amount was 100 SCCM, the gas pressure was 0.4 Pa (3 mTorr), the DC sputtering power was 4 kW and the wafer temperature was 150° C.

Figure 2D:
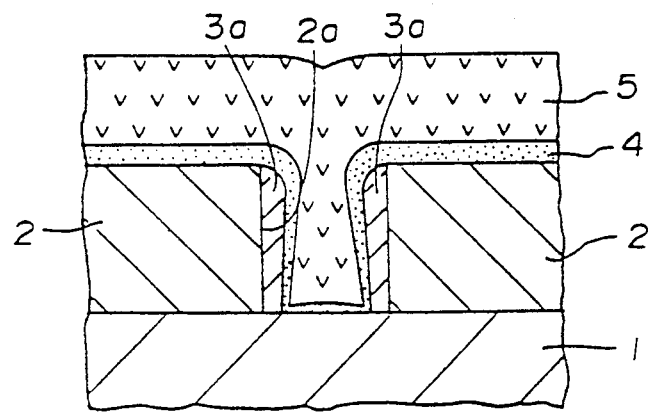

Further, as shown in FIG. 2d the through hole 2a was buried via the formation of Al-1% Si layer. This formation was carried out using two stage sputtering.

The first stage was carried out with a Ar flow amount of 100 SCCM, and a gas pressure of 0.4 Pa (3 mTorr). In this first stage the wafter heating was conducted by applying a DC sputter power of 20 kW while the Al-1% Si layer was formed to a depth of approximately 0.1 μm.

During the second stage, the rear surface of the wafter was heated by directing high temperature Argon (Ar) gas thereagainst until it reached a temperature of approximately 500° C. Simultaneously, sputtering conditions were such that DC sputtering power was 10 kW and the Al-1% Si layer 5 was increased in depth by approximately 0.4 μm. Accordingly, the finally formed Al-1% Si layer had a depth of approximately 0.5 μm.

With this technique even thought the wafer was heated to a high temperature, the side wall of the through hole 2a was coated with SiNx and at least said side wall was such that the Ti layer associated therewith was not subject to oxidation. As a result, the Al-1% Si layer was able to flow smoothly over the surface of the Ti layer. When the wafter was sectioned it was found that through hole 2a was completely filled with Al-1% Si and no cavitation or incomplete filling was observed.

It should be noted that the Al-1% Si layer need not necessarily be formed in the the above described two stage manner. However, if the Al-1% Si layer is grown using an initially high temperature the layer tends to assume a bird-like condition. In order to avoid this the process is divided into 2 stages with the first stage being carried out under low temperature conditions. In accordance with this the quality of the Al-1% Si layer is improved. Further, the second stage of the sputtering can also be carried out with a wafter bias in the order of 200–400 V (in the case of 13.5 MHz).

EXAMPLE 2

In this embodiment of the invention, a contact hole which is formed in a silicide layer in which a low resistance type MOS transistor is formed and which connects the source/drain zones thereof, is buried in an Al type layer. A detailed description will be given with reference to FIGS. 3 to 11.

Figure 3:
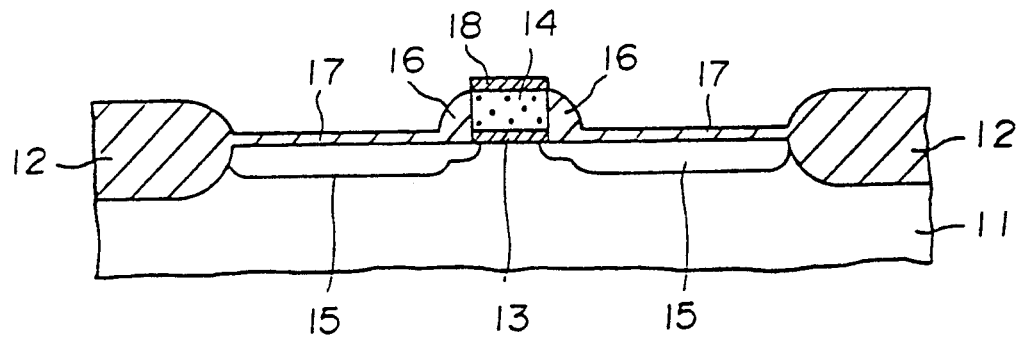
FIG. 3 is a cross-sectional view which shows an example wherein the present invention has been applied to form an interconnector formation for a low resistance type MOS transistor and wherein a SiO$_2$ layer is formed over an element defining zone and over a gate electrode.

Firstly, as shown in FIG. 3, a field oxide membrane 12 is formed on a silicon base 11 using a LOCOS technique by way of example. Then, a gate electrode 14 is formed with respect to the field oxide membrane by way of an element defining zone gate insulating membrane 13 using DOPOS.

Following this, using the gate electrode 14 as a mask, source/drain zones 15 are formed by a first ion implantation. After this, a side wall 16 is formed from oxidized silicon etc., using conventional CVD and RIE techniques.

Additionally, 50 Å thick SiO$_2$ layers 17, 18 are formed on the surfaces of the element defining zones and the gate electrode 14 by way of thermal oxidation (for example) after having removed the naturally forming oxide layers which are present on the surfaces of the element defining zones. The reason for the the removal of the naturally forming oxide layer is to ensure that the layers 17 and 81 have uniform thickness.

Further, it is not essential that the layers 17 and 18 be formed by oxidizing the surface(s) of the base member and can be formed by thermally oxidizing a layer of polycrystalline silicon which has been coated over the whole upper surface, to form the SiO$_2$ layers and then etching in order to achieve the required thickness.

Moreover, the above mentioned gate electrode 14 and the side walls 16 are used as a mask for a second ion implantation doping of a given section(s) of the source/drain zones 15 by way of the SiO$_2$ layer 17. With this a LDD construction is achieved.

At this stage, the SiO$_2$ layer 18 on the gate electrode 14 is ion implanted to form a channeling inhibiting layer.

Figure 4:
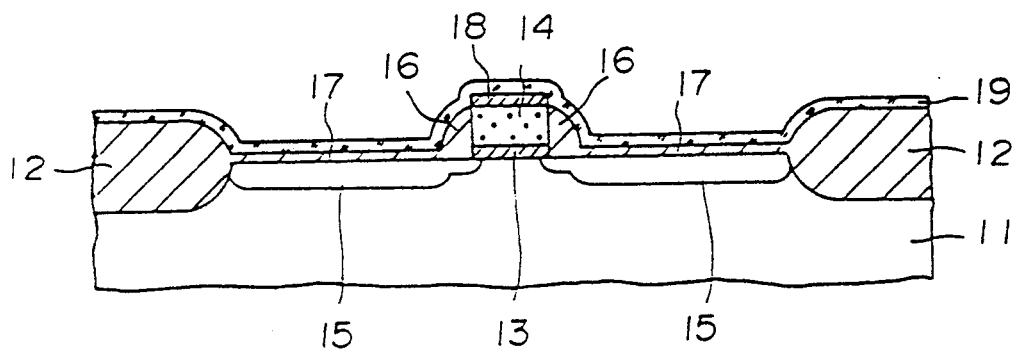
FIG. 4 is a cross-sectional view showing the wafer of FIG. 3 with a Ti layer formed over the entire surface.

Next, a Ti layer 19 having a thickness of approximately 0.03 μm was formed over the upper surface in the manner illustrated in FIG. 4, using a Ti sputtering wherein the argon flow amount was 100 SCCM, the gas pressure was 0.47 Pa (3.5 mTorr), the DC sputter power was 4 kW, and a wafer temperature was 150° C.

Following this, the wafer shown in FIG. 4 was subject to lamp annealing for 30 seconds at 650° C. in an argon gas atmosphere. A predetermined portion of the above mentioned Ti layer, the base plate 11 (more specifically the source/drain zones 15), the gate electrode 14 and each of the SiO$_2$ layers 17, 18, were subject to a reaction and converted into TiSi layers (not shown).

Subsequently, etching was carried out for 10 minutes using a solution of H$_2$O$_2$:NH$_4$OH:H$_2$O=2:1:2 (molar) to selectively etch the reacted portions of the above mentioned Ti layer 19.

Figure 5:
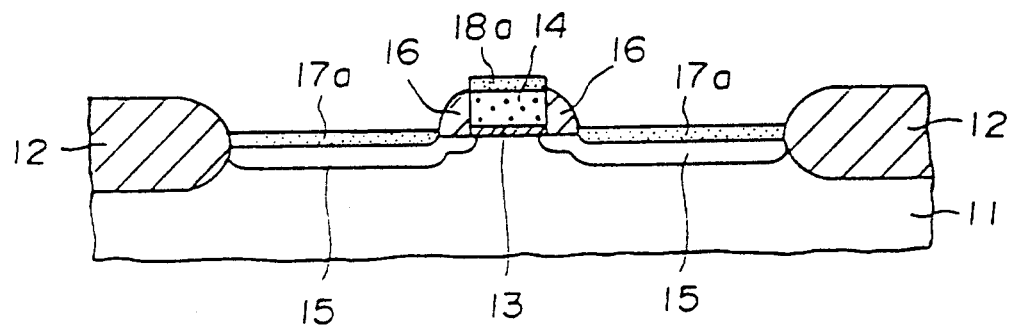
FIG. 5 is a cross-sectional view showing the condition wherein a TiSi$_2$ layer is selectively formed over the source/drain zones and gate electrode using a silicide type reaction.

Following this, lamp annealing in N$_2$ atmosphere at 900° C. for 20 seconds was carried out so that the above mentioned TiSi layer, the silicon base plate 11 and the gate electrode 14 were reacted to assume the condition illustrated in FIG. 5, and so that the TiSi₂ layers 17a, 18a were formed.

At this stage due to the fact that the above mentioned lamp annealing which produced the silicide change, was divided into two stages, the TiSi₂ layers 17a, 18a were well formed over the element defining zones and the gate electrode. Finally, as the silicide change was conducted at close to 900° C. there is considerable concern that the leak amount between the gate electrode 14 and the source/drain zones 15 would be increased as the field oxide layer 12 and the side walls 16 located above TiSi₂ layers 17a, 18a, would become extended.

It should be noted that, the applicant has proposed the conversion of above mentioned SiO₂ layers 17, 18 into the TiSi₂ layers in JP-B-3-38823 and is also introduced in the monthly SEMICONDUCTOR WORLD June 1991 pages 44-48 (Press Journal company publication). In connection with this process, as the silicide change reaction is effected through an oxide material layer it is referred to as SITOX (silication through oxide). When compared with the commonly used prior art SALICIDE (self aligned silicide) process, the instant technique is such that the TiSi₂ layers are selected only with respect to the element defining zones and it is possible to form MOS transistors which exhibit excellent junction leakage characteristics. Moreover, at the time the membranes are formed the silicide reaction rate is low and the layer quality extremely fine whereby high is barrier characteristics are obtained, and even though annealing is applied the sheet resistance is maintained low.

Figure 6:
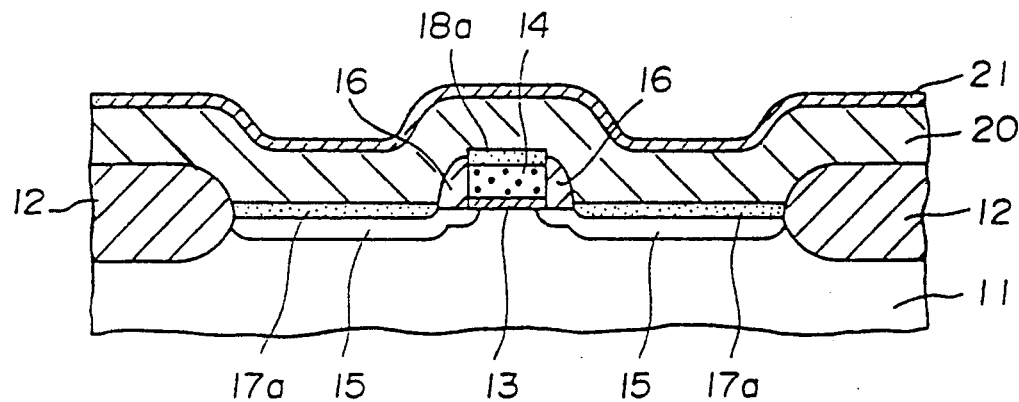
FIG. 6 is a cross-sectional view showing the condition wherein a PSG interlayer insulation membrane and a first SiNx layer are formed one on top of the other.

Next, as shown in FIG. 6, the upper surface of the wafer is covered by an insulative PSG layer 20 having a thickness of about 0.7 μm. Followed by a SiNx layer which is formed using plasma CVD technique and which has a thickness of about 0.1 μm. This SiNx layer 21 is formed under the same conditions as the SiNx layer 3 of the first embodiment.

Figure 7:
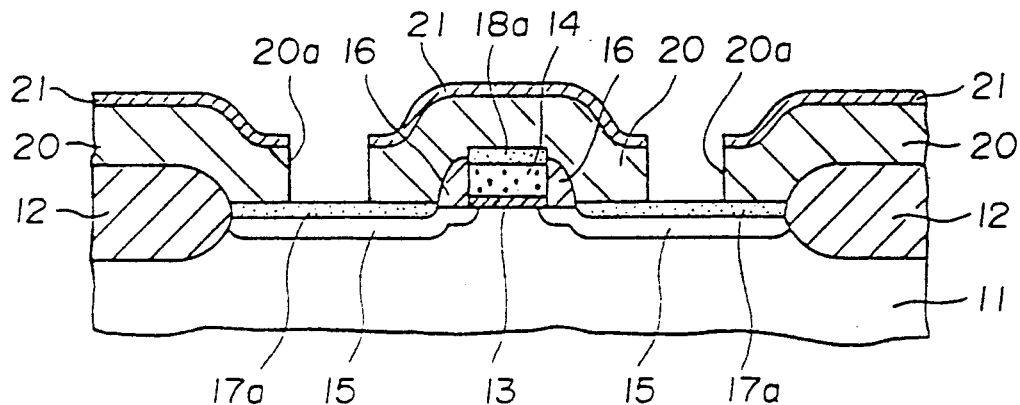
FIG. 7 is a cross-sectional view showing the PSG interlayer insulation membrane and the SiNx layer etched to form contact holes.

After this, as shown in FIG. 7 normal photolithography and RIE (reaction ion etching) are used and 0.4 μm diameter contact holes 20a are opened down to the TiSi₂ layers 17a and 18a.

Figure 8:
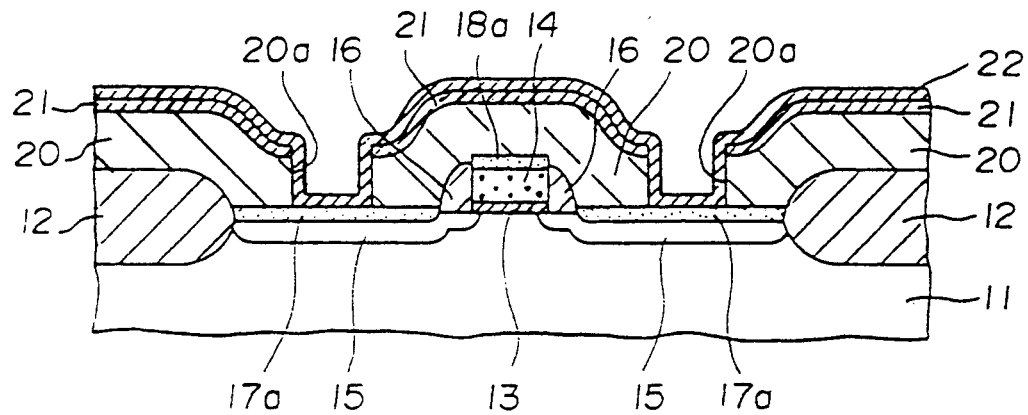
FIG. 8 is a cross-sectional view showing a wafer wherein the whole upper surface is covered with a second SiNx layer.

Following this, as shown in FIG. 8, the upper surface of the wafer is covered with a second layer of SiNx 22 having thickness of about 0.1 μm. This layer is formed under the same conditions as described in connection with layer 3 of the first embodiment.

Figure 9:
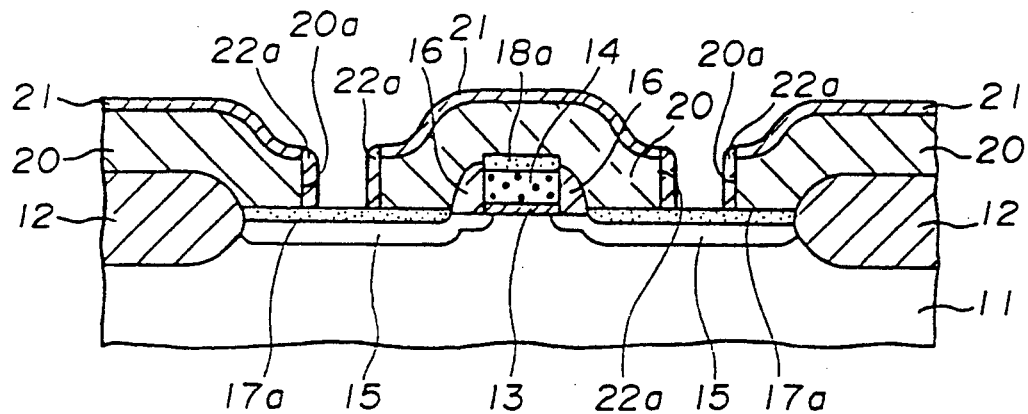
FIG. 9 is a cross-sectional view showing the second SiNx layer etched to leave only the side walls of the contact holes covered with the same.

The second SiNx layer 22 is then etched as shown in FIG. 9 so that only the walls of the contact holes are alone covered with SiNx side walls 20a. This etching is carried out under the same conditions as the etching of the side walls 3a of the first embodiment.

Figure 10:
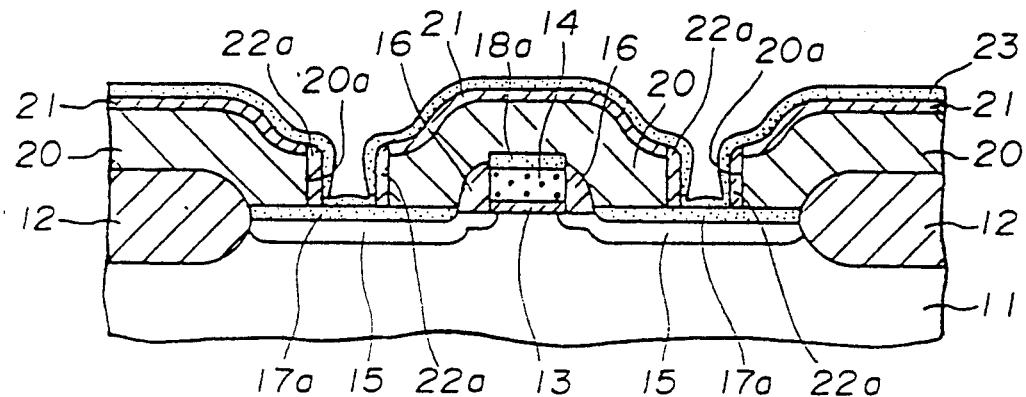
FIG. 10 is a cross-sectional view which shows the entire upper surface of the wafer covered with a second layer of Ti.

Next, as shown in FIG. 10 the upper surface of the waver is formed with a barrier metal coating in the form of Ti layer 23 which has a thickness of about 0.1 μm. This Ti layer is formed under the same conditions as the Ti layer 4 disclosed in connection with the first embodiment.

Figure 11:
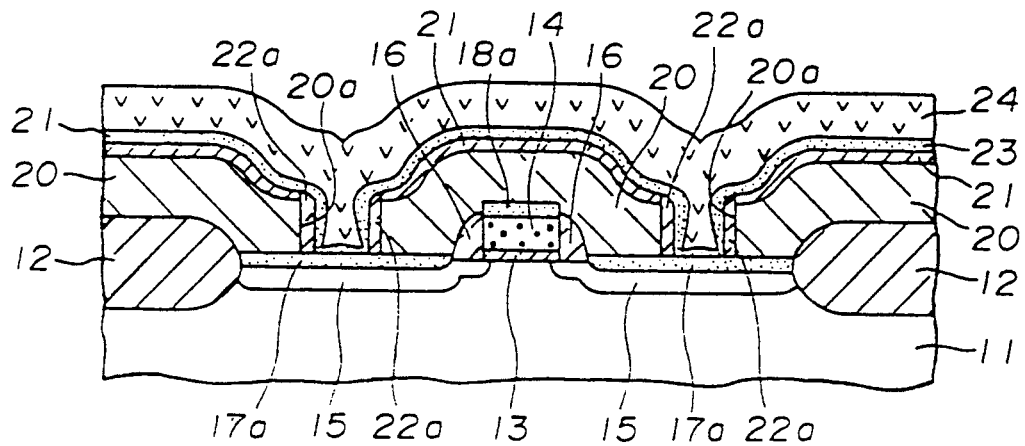
FIG. 11 is a cross-sectional view which shows the contact holes buried by an Al layer.

Further, as shown in FIG. 11 an Aluminium layer having a thickness of about 0.5 μm is formed on the upper surface of the wafer under the same conditions as used in connection with the formation of the Al-1% Si layer of the first embodiment.

With the above described process, the contact holes 20a are uniformly buried in the Al layer. In this embodiment, in accordance with the first and second SiNx layers 21, 22a the exposed surface of the PSG insulation membrane 20 is completely coated in the SiNx material and as such there is no direct contact with the second Ti layer 23. Therefore, prevention of the effect which tends to oxidize the second Ti layer 23 is improved and the Aluminium layer 24 burying characteristics are improved.

It should be noted that the burial of the contact holes 20a in the instant embodiment was carried out by using pure Aluminium (Al) and that the use of the SITOX technique renders it possible to form TiSi₂ layers which exhibit extremely good barrier characteristics and therefore has merit when used with substratum levels.

Conventionally, Al-1% Si alloys have become widely used in semiconductor devices. These alloys have been previously limited to the inclusion of Si until fixed melting limits. However, the inclusion of Si tends to increase the electrical resistance and to reduce the connection characteristics of the layers. These drawbacks are particularly apparent in the instance wherein the diameter of the connection holes is reduced. However, the use of the SITOX method in the formation of substratum TiSi₂ layers, allows the use of pure aluminium and therefore eliminates the problems encountered with Si alloys.

EXAMPLE 3

In this embodiment features through holes which are formed in a PSG interlayer insulation membrane disposed on a substratum interconnector layer, and which are buried in a Al-1% Si alloy layer.

This embodiment is basically the same as that disclosed in connection with the second embodiment and for this reason the process according to the instant embodiment will be discussed with reference to FIG. 12 which has been abbreviated for ease of illustration.

Figure 12:
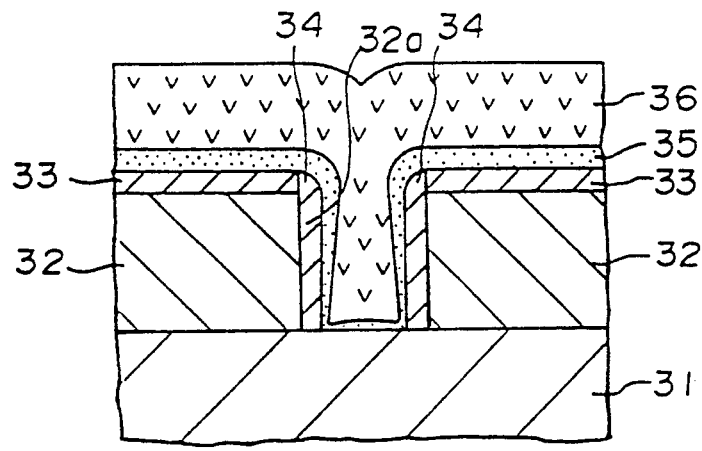
FIG. 12 is a cross-sectional view showing the wafer in its final form and depicting a through hole buried in accordance with the present invention.

FIG. 12 shows the completed construction. The following discloses the steps via which this construction was achieved.

First, a PSG interlayer insulation membrane 32 having a thickness of approximately 0.7 μm and SiNx 33 layer of approximately 0.1 μm thickness were formed on a substratum interconnector layer 31. Through hole(s) 32a was formed by patterning. Following this, the upper surface of the wafer was covered with a layer of SiNx (not show). This was then etched to leave the wall of the through hole(s) only covered with SiNx and thus form side walls. After this, the Ti layer 35 and the Al-1% Si layers were formed.

In this embodiment the burial of the through hole(s) with Al-1% Si was preferred.

EXAMPLE 4

Figure 13A:
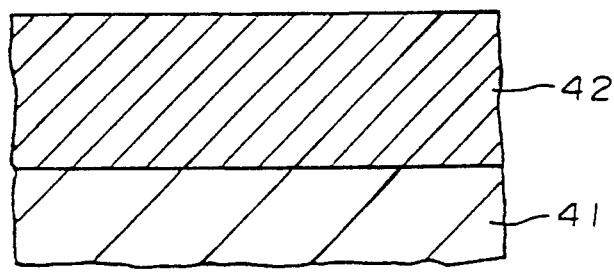
Figure 13B:
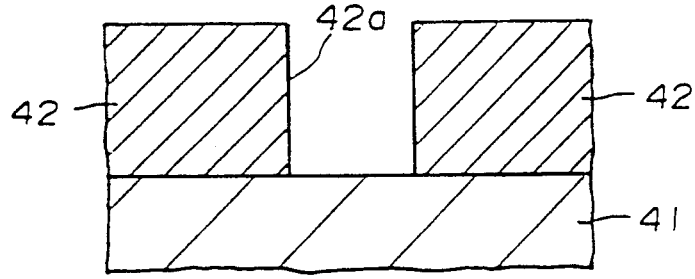
Figure 13C:
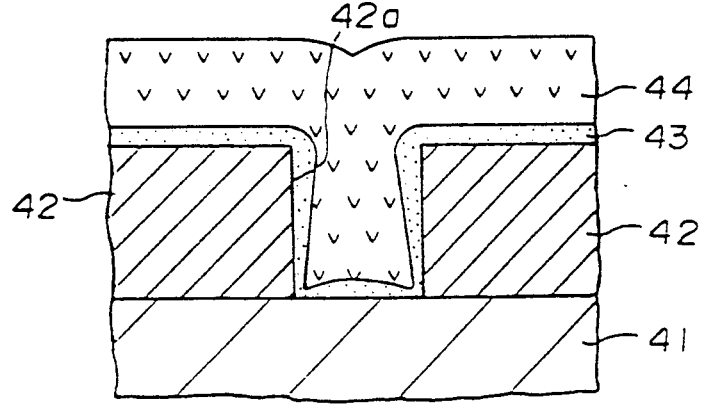

In this embodiment which is disclosed in FIGS. 13a-13c, through holes formed in a SiNx interlayer insulation membrane are buried in Al-1% Si.

First, as shown in FIG. 13a, a SiNx interlayer insulation membrane 42 having a thickness of 0.8 μm was formed on a substratum interconnector layer 41. The conditions for this formation were the same as disclosed in connection with the SiNx layer 3 of the first embodiment.

Photolithographic and RIE (reaction ion etching) were used after patterning of the SiNx layer to form the 0.4 μm diameter through holes 42a illustrated in FIG. 13b. Then, as shown in FIG. 13c, the through holes 42a were coated with a layer of Ti (thickness approx 1.0 μm) and then layer 44 of Al-1% Si (approx 0.5 μm).

With this embodiment, as the interlayer insulation membrane was formed of SiNx, the Ti layer 43 was formed so that there was no direct contact and so that no problem was generated. It was preferred to bury the through hole 42a with a layer of Al-1% Si in this instance also.

EXAMPLE 5

Figure 14A:
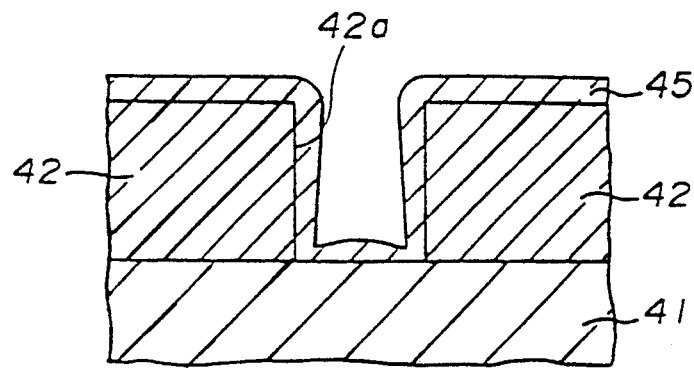
Figure 14B:
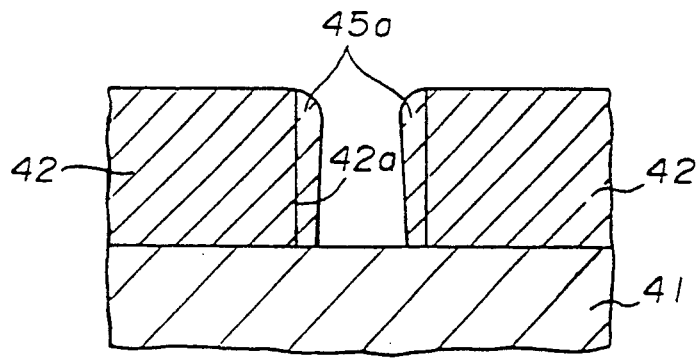
Figure 14C:
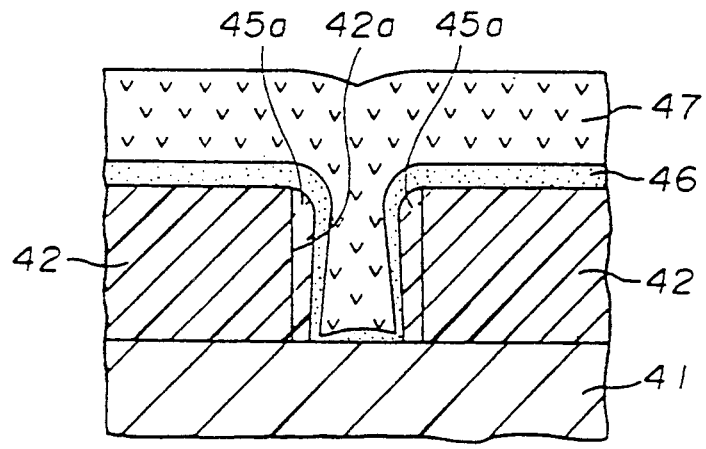

In this embodiment through holes were formed in a SiNx interlayer insulation membrane and side walls of SiNx formed on the sides of the holes. This process is shown in FIG. 14a–14c. It should be noted that in FIGS. 14a–14c, like numerals used in FIGS. 13a–13c are used to denote like elements.

First, as shown in FIG. 14a a SiNx interlayer insulating membrane 42 is formed on top of a substratum interconnector layer 4, so as to have a thickness of about 0.8 μm. This membrane is then patterned and 0.4 μm diameter through holes 42a are formed therein. The process thus far is the same as that disclosed in connection with the fourth embodiment. The through holes 42a are then coated with a layer 45 of SiNx having a thickness of about 0.1 μm. Following this the SiNx layer 45 is etched to form side walls 45a.

After this, as shown in FIG. 14c, the through holes 42a are coated with a Ti layer 46 and then buried in a Al-1% Si layer 47.

In the case of the instant embodiment, as the interlayer insulation membrane is formed of SiNx, the above mentioned SiNx side walls 45a are provided for the purpose of preventing the oxidation of the Ti layer 45, are not especially essential. This contributes to the treatment of through holes which have a fineness which exceed the photolithographic resolution limits.

Although 5 embodiments of the present invention have been disclosed, the present invention is not necessarily limited to the same and variations wherein the substratum Ti layers are replaced with TiN, WSix, polycrystalline silicon layers, will provide equally good wetting characteristics with the Al type material layers.

The materials from which the oxidized silicon type insulation membranes are formed can be selected from the above mentioned PSG, SOG (spin on glass), BSG, BPSG, AsSG, AsPSG, AsBSG and the like and/or various combinations of the same.

Further, the Al type material or Al material which is used to bury the connection holes can include the above mentioned Al-1% Si alloy, pure Al, Al-Si-Cu alloy and the like.

What is claimed is:

1. A method of forming an interconnector configuration comprising:
   forming a through hole in a silicon oxide insulation membrane formed on a substratum interconnector layer, said substratum interconnector layer being formed on a base plate, so that said through hole extends to said substratum interconnector layer;
   forming a silicon nitride layer on at least the wall surface of said through hole;
   forming a second substratum layer on at least the side and bottom walls of said through hole;
   forming an aluminum material layer on the second substratum layer to fill at least said through hole while heating the base plate.

2. A method as set forth in claim 1 wherein said silicon oxide insulation membrane is formed of at least one of SiO2, SOG, PSG, BSG, BPSG, AsSG, AsPSG and AsBSG.

3. A method as set forth in claim 1 wherein said substratum interconnector layer is formed of at least one of an Aluminium material layer, a polycrystalline silicon layer, a high melting point metallic silicide layer, a polycide layer, and a doped zone.

4. A method as set forth in claim 1 wherein said silicon nitride layer which is coated over said through hole, is etched so as to leave said through hole wall selectively covered therewith.

5. A method as set forth in claim 1 wherein said second substratum layer is formed of one of at least one of Ti, TiNx, WSix, polycrystalline silicon.

6. A method of forming an interconnector configuration comprising:
   forming a contact hole in a PSG interlayer insulation membrane which is formed on a Si base plate, said Si base plate having doped regions and said contact hole extending to said regions;
   using a CVD plasma technique to form a silicon nitride layer over the entire surface of the arrangement;
   using ion etching to etch said silicon nitride layer so that only the wall of said contact hole is covered with said silicon nitride layer and thus define side wall layers thereon;
   forming a Ti layer over the entire surface of the arrangement; and
   forming a Al-1%Si layer over the entire surface of the arrangement while heating the same.

7. A method as set forth in claim 6 wherein a surface layer section of said doped region is a self-adjustingly formed silicide layer and which is induced to have a low resistance.

8. A method as set forth in claim 6 wherein said contact hole has an aspect ratio of 1 or more.

9. A method of forming an interconnector configuration comprising:
   forming a silicon oxide interlayer insulation membrane and a first silicon nitride layer on a base plate which has a substratum interconnector layer;
   etching said silicon oxide interlayer insulation membrane and first silicon nitride layer to form a connection hole which extends to said substratum interconnector layer;
   forming a second silicon nitride layer over at least the wall of said connection hole;
   forming a second substratum layer on at least the interior side and bottom walls of said connection hole;
   forming an aluminum material layer on the second substratum layer while heating the base plate so as to induce the aluminum layer to fill said connection hole.

10. A method as set forth in claim 9 wherein said silicon oxide interlayer insulation membrane is formed from at least one of SiO2, SOG, PSG, BSG, BPSG, AsSG, AsPSG and AsBSG.

11. A method as set forth in claim 9 wherein said substratum interconnector layer is formed of at least one of an Aluminium material layer, a polycrystalline silicon layer, a high melting point metallic silicide layer, a polycide layer, and a doped zone.

12. A method as set forth in claim 9 wherein said silicon nitride layer which is coated over said connection hole, is etched so as to leave said connection hole wall selectively covered therewith.

13. A method as set forth in claim 9 wherein said second substratum layer is formed of one of at least one of Ti, TiNx, WSix, polycrystalline silicon.

14. A method of forming an interconnector configuration comprising:

using a plasma CVD technique to form a first silicon nitride layer on a PSG interlayer insulation membrane which is formed on a Si base plate, said Si base plate having doped regions;

opening a contact hole in said first silicon nitride and PSG layers which contact hole extends to said doped regions;

using a CVD plasma technique to form a second silicon nitride layer over the entire surface of the arrangement;

using ion etching to etch said silicon nitride layer so that only the wall of said contact hole is covered with said silicon nitride layer and thus define side wall layers thereon;

forming a Ti layer over the entire surface of the arrangement; and forming a Al-1% Si layer over the entire surface of the arrangement while heating the same.

15. A method as set forth in claim 14 wherein a surface layer section of said doped region is a self-adjustingly formed silicide layer and which is induced to have a low resistance.

16. A method as set forth in claim 9 wherein said contact hole has an aspect ratio of 1 or more.

17. A method of forming an interconnector configuration comprising:

opening a contact hole in a silicon nitride interlayer insulation membrane so that the contact hole extends through to a substratum interconnector layer which is formed on a base plate;

forming a second layer over at least the side wall and bottom wall of said contact hole; and filling at least the contact hole having the second layer with an aluminium material layer while heating the base plate.

18. A method as set forth in claim 17 wherein said substratum interconnector layer is formed of at least one of an Aluminium material layer, a polycrystalline silicon layer, a high melting point metallic silicide layer, a polyside layer, and a doped zone.

19. A method as set forth in claim 17 wherein said second layer is formed of one of at least one of Ti, TiNx, WSix, polycrystalline silicon.

20. A method of forming an interconnector configuration comprising:

using a CVD plasma technique to form a silicon nitride interlayer insulation membrane on a Si base plate which includes doped regions;

using etching to opening contact holes in the silicon nitride interlayer insulation membrane which contact holes extend to said doped regions;

forming a Ti layer over the entire surface of the base member; and forming a Al-1% Si layer over the entire surface of the base member while heating the base plate.

21. A method as set forth in claim 20 wherein a surface layer section of said doped region is a self-adjustingly formed silicide layer and which is induced to have a low resistance.

22. A method as set forth in claim 20 wherein said contact hole has an aspect ratio of 1 or more.

* * * * *